United States Patent [19]
Pathak et al.

[11] Patent Number: 5,963,496
[45] Date of Patent: Oct. 5, 1999

[54] SENSE AMPLIFIER WITH ZERO POWER IDLE MODE

[75] Inventors: Saroj Pathak, Los Altos Hills; Glen A. Rosendale, Palo Alto; James E. Payne, Boulder Creek; Nianglamching Hangzo, San Jose, all of Calif.

[73] Assignee: Atmel Corporation, San Jose, Calif.

[21] Appl. No.: 09/064,811

[22] Filed: Apr. 22, 1998

[51] Int. Cl.$^6$ .................................................. G11C 7/00
[52] U.S. Cl. ............... 365/207; 365/189.05; 365/189.09; 365/194; 365/233
[58] Field of Search ............................. 365/207, 189.09, 365/233, 189.05, 194

[56] References Cited

U.S. PATENT DOCUMENTS

| | | | |
|---|---|---|---|
| 5,459,689 | 10/1995 | Hikichi | 365/189.09 |
| 5,563,527 | 10/1996 | Diba | 326/38 |
| 5,594,681 | 1/1997 | Taguchi | 365/207 X |

*Primary Examiner*—Do Hyun Yoo
*Attorney, Agent, or Firm*—Thomas Schneck

[57] ABSTRACT

A sense amplifier for use in a serial configuration memory includes multiple stages which are enabled and disabled in a controller manner, in response to a control pulse. The control pulse is produced every Nth period of an externally provided clock signal, the clock being used to clock out a bitstream representing the contents of the memory device. In a preferred embodiment, N such sense amps are utilized to read out in parallel fashion the N memory cells (bits) that constitute an accessed memory location. The sense amps are therefore active only of a period of time sufficient to read out a memory cell.

15 Claims, 7 Drawing Sheets

SENSE AMPLIFIER WITH ZERO POWER IDLE MODE

TECHNICAL FIELD

The present invention relates to semiconductor memory devices, and more particularly to a sense amplifier for use in serial configuration memories.

BACKGROUND ART

Serial configuration memories are devices used with FPGAs. When a device such as an FPGA powers up, each of its logic blocks must be configured for a specific logic operation and its programmable interconnects must be configured to provide routing among the logic blocks to implement the intended logic function. The configuration information takes the form of a bitstream which feeds into the FPGA and is stored in the device, where the bits define logic and routing of the FPGA elements.

A serial configuration memory is the device which contains the configuration bitstream. A serial configuration memory consists of a memory array such as PROM or E$^2$PROM, an address counter, and supporting logic to provide programming and reset control. The address counter is tied to a clock input line and is incremented on each rising or falling edge of a clock signal. The counter output serves to address each bit of the memory array, producing a bitstream which is serially output to an FPGA.

Many of today's personal electronic devices are powered by an independent source, namely a battery, and so there is always a concern for conserving power wherever possible. The desire to minimize power consumption pervades every aspect of the design of these devices. FPGAs find use in many such devices, including laptop computers, notepad computers, and cellular telephones. Configuration memories, therefore, present an opportunity where improvements can be made to minimize power consumption.

SUMMARY OF THE INVENTION

The present invention is directed to a sense amplifier scheme for use in a memory device which receives an external clock signal and produces a bitstream at a frequency equal to the external clock. The sense amp includes a differential amp stage, a voltage reference stage and a data latch. A control pulse (or enabling pulse) is generated every Nth period of the clock, N being the data size (in bits) of each memory location. Circuit means responsive to the control pulse provides for enabling and disabling of the two stages and the data latch in a specific order, thus providing a controlled power-up and power-down sequence of the sense amplifier.

In a preferred embodiment, N such sense amplifiers are employed to simultaneously read out the N memory cells comprising a memory location. The control pulse has a pulse width sufficient to allow each sense amplifier to read out a memory cell, after which time the sense amps are disabled. Enabling of the sense amplifiers is delayed by an amount of time sufficient to increment and decode a memory location address. In this way, the sense amplifiers are powered for a brief moment in time, namely the sense time, as compared to the time needed to serially shift out the N bits of a datum of memory.

BEST MODE FOR CARRYING OUT THE INVENTION

Figure 1:
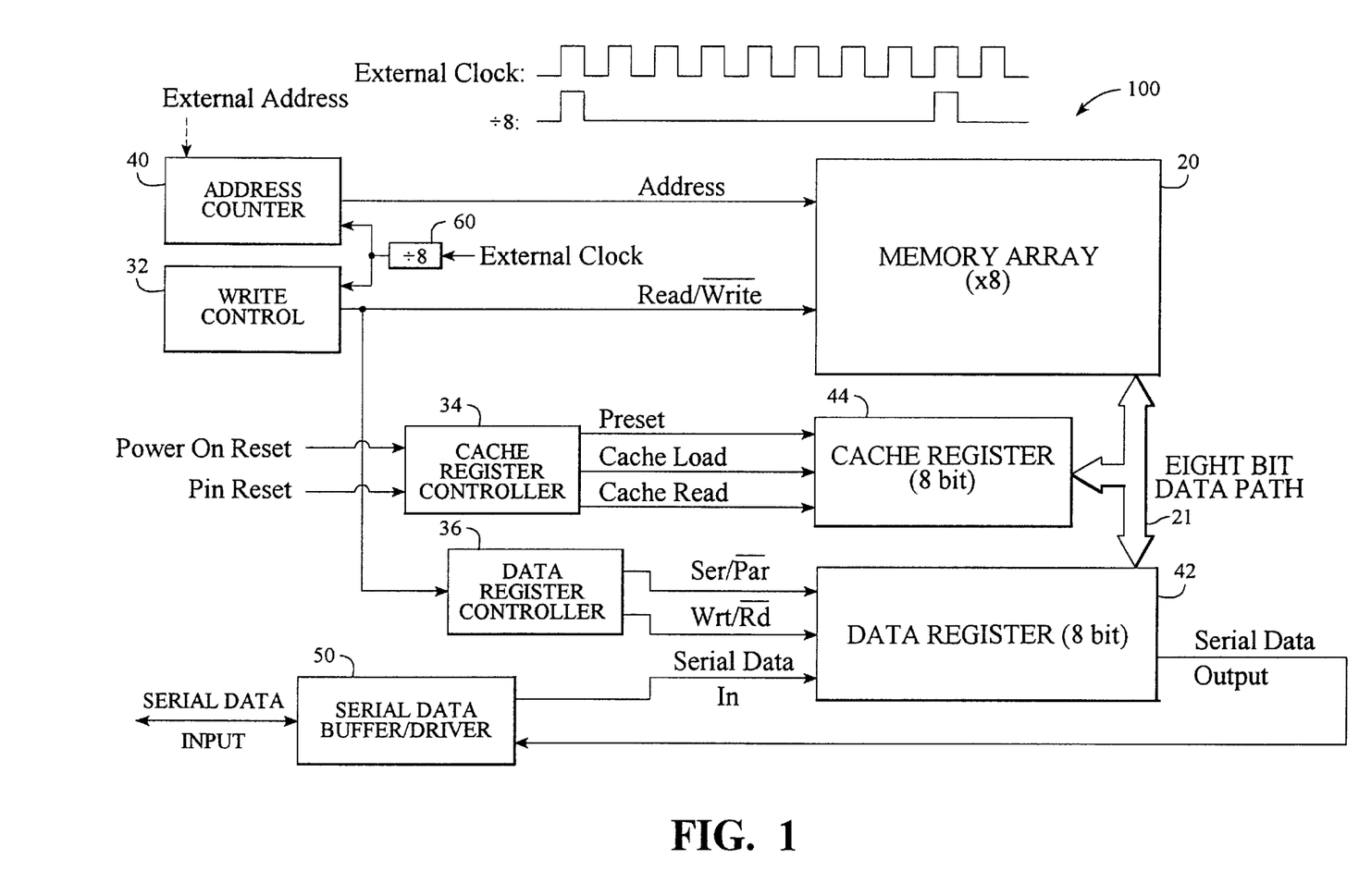
FIG. 1 is a system block diagram of the memory device in accordance with the invention.

Referring to FIG. 1, a serial configuration memory device 100 in accordance with the present invention includes a memory array 20, typically organized into an array of eight-bit bytes. Alternative data sizes for the array can be used instead, e.g. sixteen-bit words. In general, the present invention is capable of operating with N-bit data sizes, where N preferably is a power of 2.

An address counter 40 feeds into the memory array 20 which includes a decoder for decoding the address of a memory location. The address counter 40 is clocked by the output of a divide-by-eight (÷8) circuit 60. The ÷8 circuit is driven by an externally provided clock signal to provide a pulse on every eighth cycle of an EXTERNAL CLOCK. FIG. 1 shows a train of clock pulses provided by the EXTERNAL CLOCK and the resulting pulses produced by the ÷8 circuit. Thus, a stream of addresses feeds into the memory array 20 at a rate of one address every eighth clock. Again, in the general case the circuit is a divide-by-N circuit for N-bit data sizes, where an address is produced every Nth clock. A write control module 32, also driven by the ÷8 circuit, provides signaling to the memory array for read and write operations. In addition, the write control module signals a data register controller 36 to latch data read out of array 20 into a data register 42.

The memory array 20 outputs the eight bits of an accessed byte to data register 42 via a parallel eight-bit data path 21. As mentioned above, data register controller 36 operates the data register to parallel load a byte (or an N-bit datum) read out from memory 20 into data register 42; and to serially shift its eight bits out of the SERIAL DATA OUTPUT line, outputting the contents of memory 20 as a stream of bits. The SERIAL DATA OUTPUT line feeds into a serial data buffer 50 which drives the bitstream into an external device, e.g. FPGA (not shown). The serial data buffer 50 also receives data to be written into the memory array 20 to effectuate programming of the configuration memory device. Write control module 32 and data register controller 36 together operate data register 42 to serially shift data in from the SERIAL DATA INPUT and to parallel write the shifted-in data into memory 20.

The configuration memory device of the present invention further includes a cache register 44 coupled to receive a byte of data during the power-up sequence, and to load a byte previously stored in cache register 44 into data register 42 during a reset sequence. A cache register controller 34 controls the cache register to perform these operations, as will be explained below.

Figure 2A:
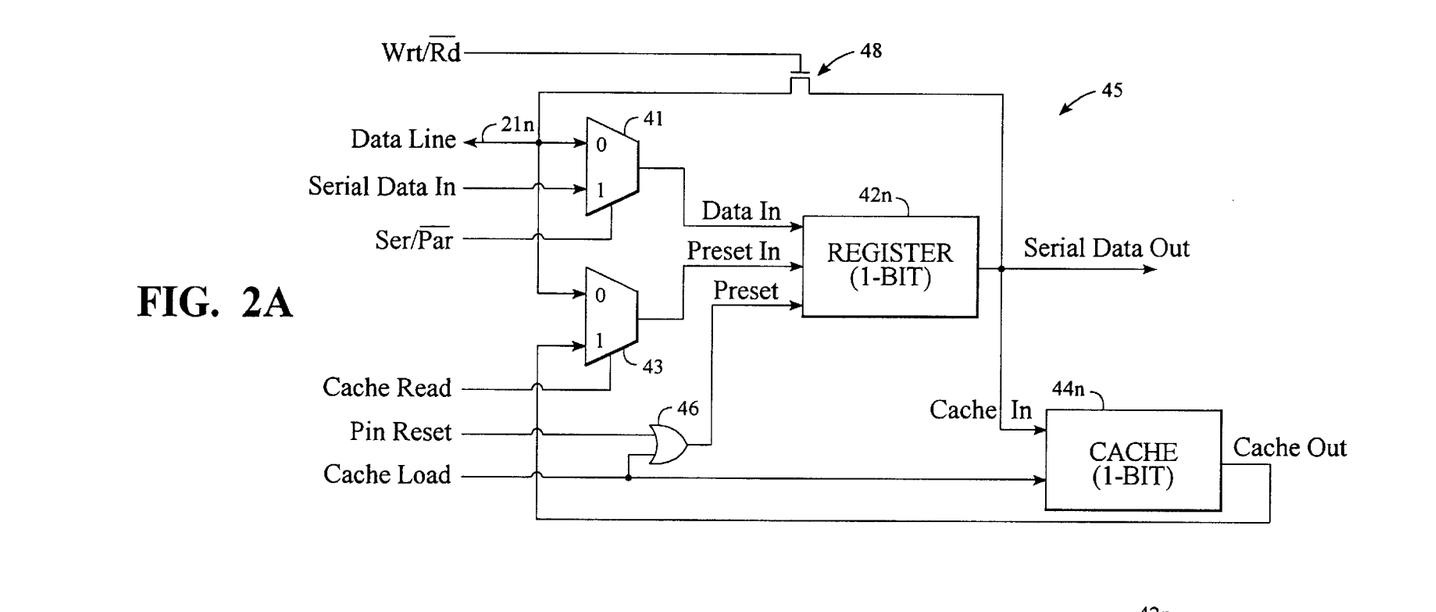
FIGS. 2A–2C and 3 illustrate the data caching scheme of the invention.
Figure 2B:
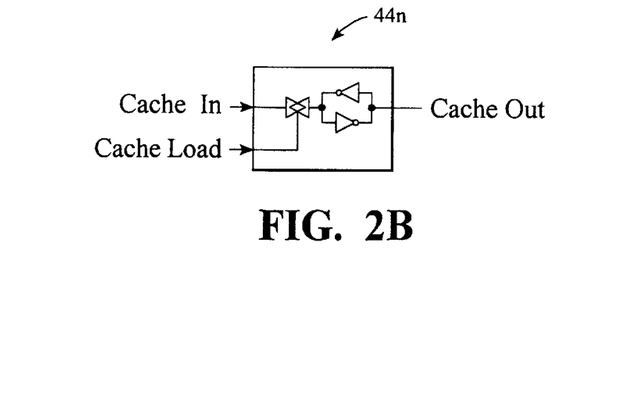

Referring now to FIG. 2A, data register 42 and the cache register 44 comprise a series of one-bit stages 45. Each stage 45 includes a one-bit register 42n and a one-bit cache latch 44n. Cache latch 44n receives its input from an output of register 42n. A CACHE LOAD control signal enables the cache latch to store the data which appears at its input line. The output of the cache latch feeds into an input of switch 43. FIG. 2B shows a typical circuit for cache latch 44n, comprising a latch circuit access which is gated by a transmission gate controlled by the CACHE LOAD signal.

Register 42n receives input from switch 41 and switch 43, and includes a PRESET control input. Switch 41 receives data from DATA LINE 21n and SERIAL DATA IN, and is switched by the SER/PAR control line. The output of switch 41 feeds into DATA IN of register 42n. Switch 43 receives data from cache latch 44n and from DATA LINE 21n, and is switched by the CACHE READ control line. The output of switch 43 feeds into PRESET IN of register 42n. Register 42n is clocked by the EXTERNAL CLOCK (not shown). The output of register 42n feeds a SERIAL DATA OUT line and as noted above feeds into cache latch 44n. In addition, the output of the register 42n is fed back to the DATA LINE 21n via pass transistor 48 which is controlled by the WRT/RD control line.

Figure 2C:
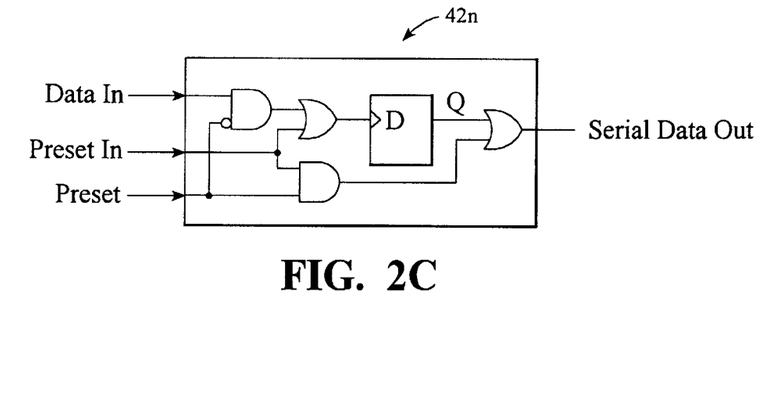

The PRESET control input is driven by the output of OR gate 46 which receives a PIN RESET signal and a CACHE LOAD signal, both originating from cache controller 34. PRESET control causes register 42n to latch data in from the PRESET IN input rather than from the DATA IN input. In addition to being latched into the register 42n, PRESET control passes the PRESET IN input directly to the output of the register. The reason for this behavior will become apparent in the explanation below. A typical circuit for the register 42n is shown in FIG. 2C.

Figure 3:
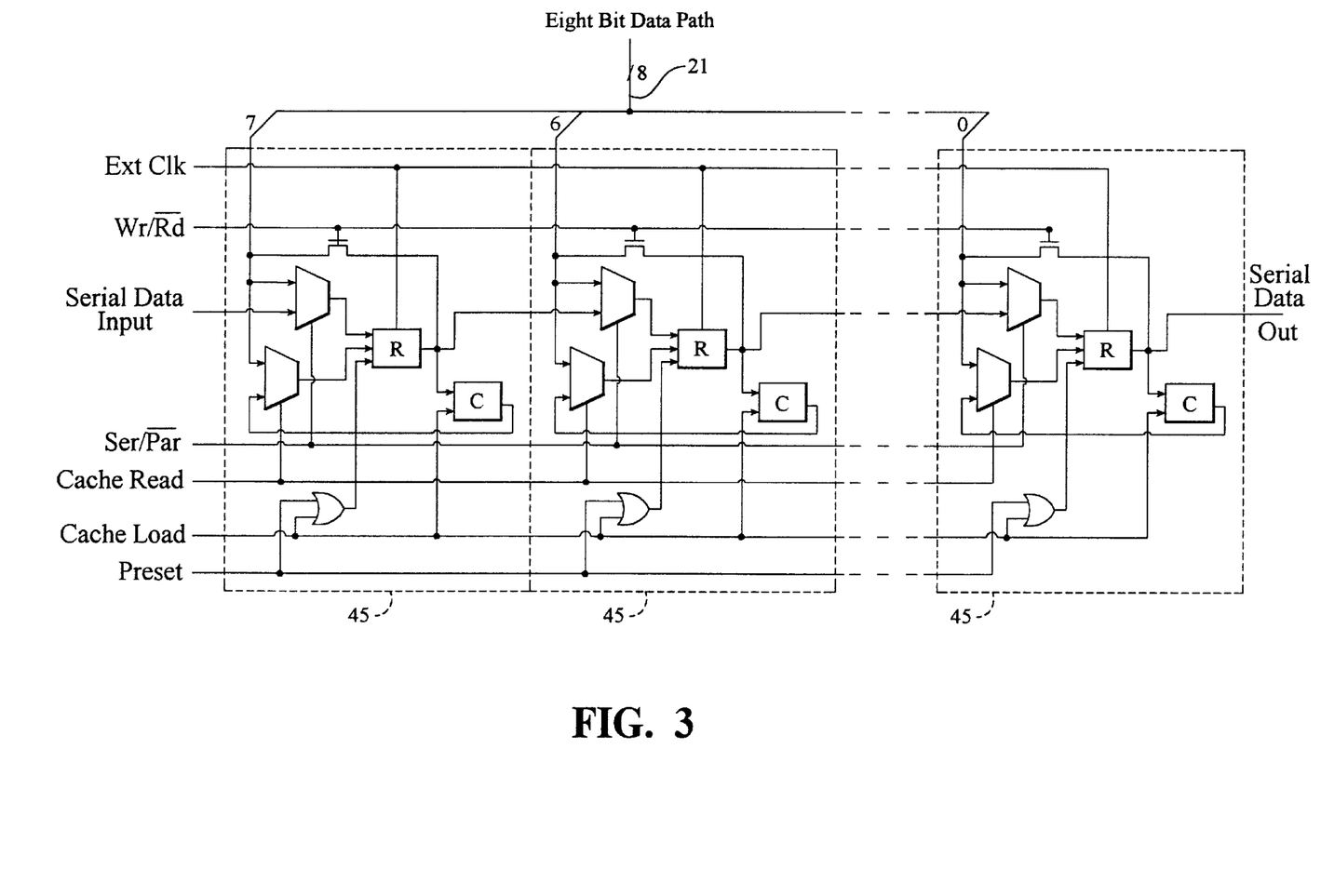

Data register 42 and cache register 44 (FIG. 1) are comprised by the coupling together of eight of the one-bit stages 45 in the manner shown in FIG. 3. For example, data register 42 is built up by coupling the SERIAL DATA OUT of one register 42n to the SERIAL DATA IN of the subsequent register. The eight-bit data path 21 from memory array 20 (FIG. 1) comprises the DATA LINE 21n of the stages 45. The SERIAL DATA OUTPUT (FIG. 1) of the data register 42 derives from the SERIAL DATA OUT line of the stage holding the least significant bit, while the SERIAL DATA INPUT of the data register is the SERIAL IN of the stage containing the most significant bit. All of the control lines are common to each of the stages.

Data register 42 and cache register 44 together perform four fundamental tasks: the data register accepts data in parallel fashion from an accessed memory location; data stored in the data register is serially shifted out on the SERIAL OUTPUT line; data to be stored in memory array 20 is serially shifted in from the SERIAL INPUT line; and data is presented in parallel fashion to eight data-in buffers (not shown) in memory array 20 when writing to a memory location.

Task 1: Loading data from an accessed memory location involves a parallel read operation. This is accomplished by asserting LO the WRT/RD and the SER/PAR control lines of each of the one-bit stages 45 comprising the data register 42. A LO on WR/RD turns off a pass transistor 48, so that the output from memory 20 via DATA LINE 21n feeds into switch 41 and 43. Also, a LO on SER/PAR switches DATA LINE 21n to DATA IN of register 42n. The PIN RESET and CACHE LOAD lines are LO so that the register clocks its data from DATA IN rather than PRESET IN.

Task 2: Serial shifting of data contained in data register 42 is accomplished by asserting a logic LO on WRT/RD and a HI on SER/PAR. WRT/RD turns off pass transistor 48 to isolate SERIAL DATA OUT from DATA LINE 21n. SER/PAR switches SERIAL DATA IN from a preceding register 42n so that each tick of the EXTERNAL CLOCK effectuates a shift propagation of the data from one register 42n to the next.

Task 3: Serially shifted input from SERIAL DATA INPUT (FIG. 1) requires asserting a HI on SER/PAR in order to serially clock data into the data register. WRT/RD is asserted LO to turn off pass transistor 48 so that the output of register 42n is isolated from DATA LINE 21n.

Task 4: Data shifted into the data register is written into memory 20 by asserting a HI on WRT/R. Since the data to be written is sitting at the output of each register 42n, turning on pass transistor 48 presents the data in parallel fashion to the data-in buffers (not shown) of memory array 20.

During the power-up (power-on reset) sequence and the externally driven reset sequence of the memory device, operation of the data and cache registers 42, 44 proceed in a different manner. Referring again to FIG. 2, during a power-on reset (POR) cycle, CACHE READ is asserted LO and CACHE LOAD is asserted HI. CACHE READ switches DATA LINE 21n to PRESET IN of register 42n. CACHE LOAD loads PRESET IN into register 42n. As explained above with respect to FIG. 2C, asserting PRESET couples PRESET IN directly to the output of the register 42n. Moreover, in the case when CACHE LOAD is asserted HI, PRESET IN is loaded into the cache latch 44n as well (see FIG. 2A and 2B). Thus, when a first byte of data (usually the byte contained in memory location 0) is sensed during the POR cycle, it is presented on the eight-bit data path 21 (FIG. 1), which feeds into each DATA LINE 21n, and is loaded into the registers 42n and the cache latches 44n comprising data register 42 and cache register 44 respectively. This operation is asynchronous, and when CACHE LOAD goes LO, data register 42 (as well as the cache register) contains the first byte. When the first clock comes along, data register 42 will have been pre-loaded with a byte and will be ready to start shifting data out.

During an externally driven reset cycle, there is not enough time to sense and load the first byte into the data register 42. Typically, a reset cycle completes in a matter of tens of nanoseconds (e.g. 20 nanoseconds), as compared to a POR cycle which requires on the order of microseconds to complete before the device is ready to output its bitstream. Recall, however, that the cache register 44 has already been pre-loaded with the first byte during the POR cycle. Thus, CACHE READ is asserted HI so that PRESET IN is switched to receive the output of the cache latch 44n. PIN RESET (via cache controller 34) is asserted HI so that register 42n loads its input from PRESET IN rather than DATA IN. Instead of accessing a memory location and sensing the byte to be loaded into the data register 42, the first byte is loaded directly from the cache register 44 during a reset cycle, an operation that can be accomplished within the time to complete the reset cycle. Again, this is an asynchronous operation, and as soon as the PIN RESET condition clears, the data register 42 holds the cached byte and is ready to be clocked out.

Figure 4:
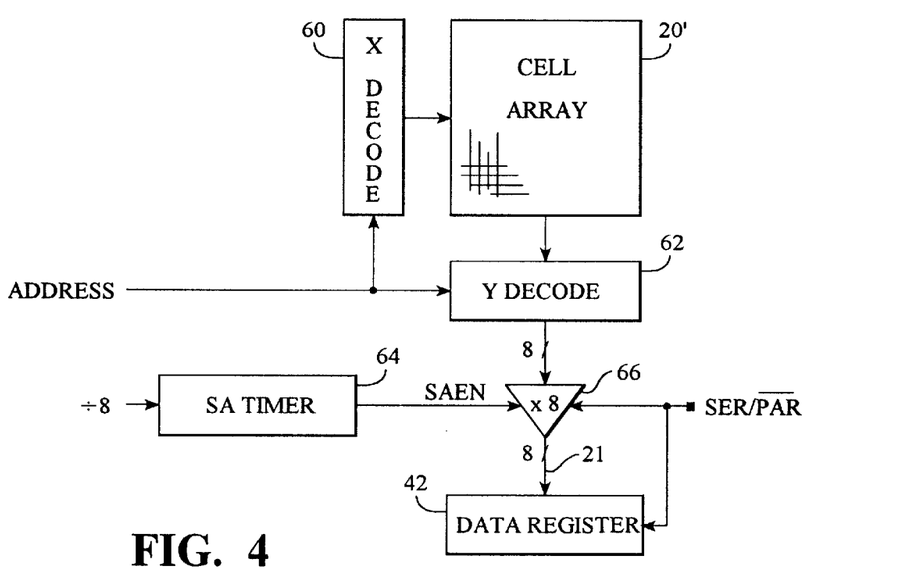
FIG. 4 is a block diagram showing the memory array of the present invention.

Referring now to FIG. 4, the memory array 20 is shown comprising a cell array 20' having a plurality of programmable memory cells, such as an array of floating gate devices. X- and Y- decoders 60, 62 receive an address and provide the necessary decoding logic to access a memory location within cell array 20'. The output of the Y-decoder feeds into sense amp circuitry 66 which comprises a series of eight sense amplifiers (FIG. 5) acting in parallel. In accordance with the present invention, the Y-decoder feeds all N bits (e.g. 8 bits) of an accessed memory location in parallel fashion into the sense amp circuitry 66, thus providing parallel sensing of the bits. The output of the sense circuitry is coupled to the data register 42 via data lines 21. A timer 64 provides an enable signal SAEN to turn on and turn off the sense circuitry, and is driven by the ÷8 clock. SER/PAR latches the read out data from the sense amps 66 into the data register 42.

Figure 5:
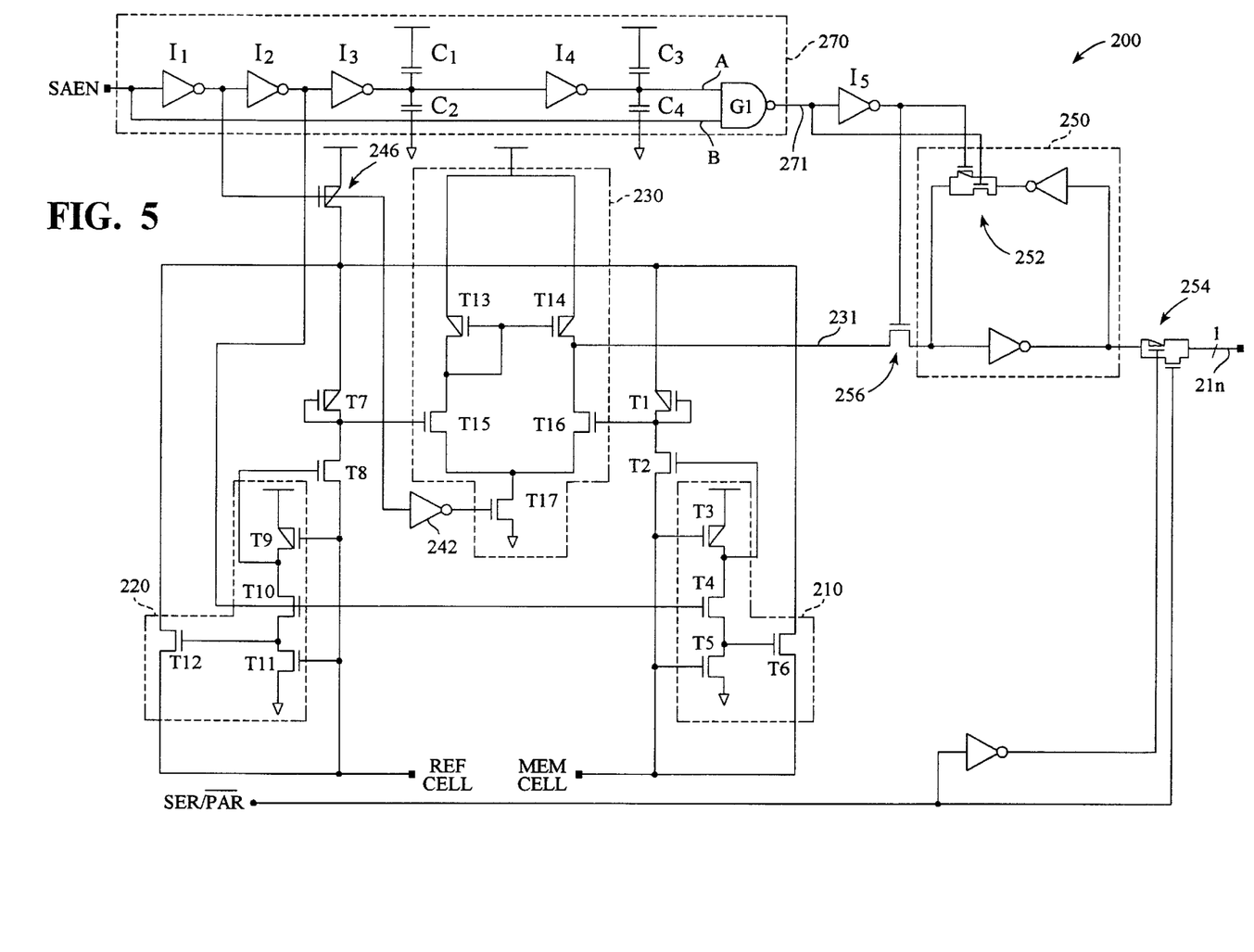
FIG. 5 is a schematic of a sense amplifier in accordance with the invention.

FIG. 5 shows each such amplifier 200, comprising sense amps 66, in greater detail. Transistors T13 T17 comprise a differential amp stage 230. On the memory cell side of the diff. amp 230 is a voltage reference section 210 and a current-to-voltage stage comprising transistors T1 and T2. Similarly on the reference cell side is a voltage reference 220 and a current-to-voltage stage comprising transistors T7 and T8. The output 231 of the diff amp (i.e. the sensed bit) feeds through pass transistor 256 to be stored in latch 250. The output of the latch is coupled to the sense amp output line 21$n$ via transmission gate 254 which is turned on by the SER/PAR line.

The sense amp 200 further includes, in accordance with the present invention, a sense amp enabling circuit 270. The enabling circuit is driven by a sense amp enable signal SAEN derived from the timer 64 shown in FIG. 4. The enabling circuit comprises a string of inverters I1–I4, interspersed with pairs of delay capacitors C1/C2 and C3/C4. The output 271 of the enabling circuit 270 operates a transmission gate (comprised of transistor pair 252 and inverter I5) which is coupled in-line with the latch 250 in the manner shown in FIG. 5. The output 271 also drives (via inverter I5) the gate of pass transistor 256.

With respect to the enabling circuit 270, the SAEN signal feeds directly into input B of NAND gate G1 and into inverter I1. The output of inverter I1 feeds into the gate of a P-channel transistor 246 and into inverter 242. Inverter I1 turns on and off transistor 246 and inverter 242 at the same time. The output of inverter I2 switches N-channel transistors T4 and T10. The output of inverter I4 feeds into input A of NAND gate G1. Because of the delay capacitors, the signal arriving at input A is delayed relative to the signal at input B by an amount of time based upon the capacitance values of the delay capacitors and to some degree the delay of inverters I1–I4.

Operation of the sense amp 200 will now be described with reference to FIG. 5 and the timing chart of FIG. 6. Referring first to FIG. 5, as SAEN transitions from LO to HI during a power-up sequence, the signal out of inverter I1 goes LO, thus turning on transistor 246 thereby supplying $V_{cc}$ to transistors T1, T6, T7, and T12. Inverter I1 also turns on transistor T17 via inverter 242, thus enabling differential amp 230 by providing a path to ground. A short delay thereafter, the output of inverter I2 goes HI. This turns on transistors T4 and T10, thereby turning on the voltage reference stages 210, 220. At this time, the power-up sequence for the sense amp has completed. This power-up sequence guarantees a clean switchover of the sense amp from a non-powered state to a powered state, avoiding any transients which might appear at the sense amp output 21.

Figure 6:
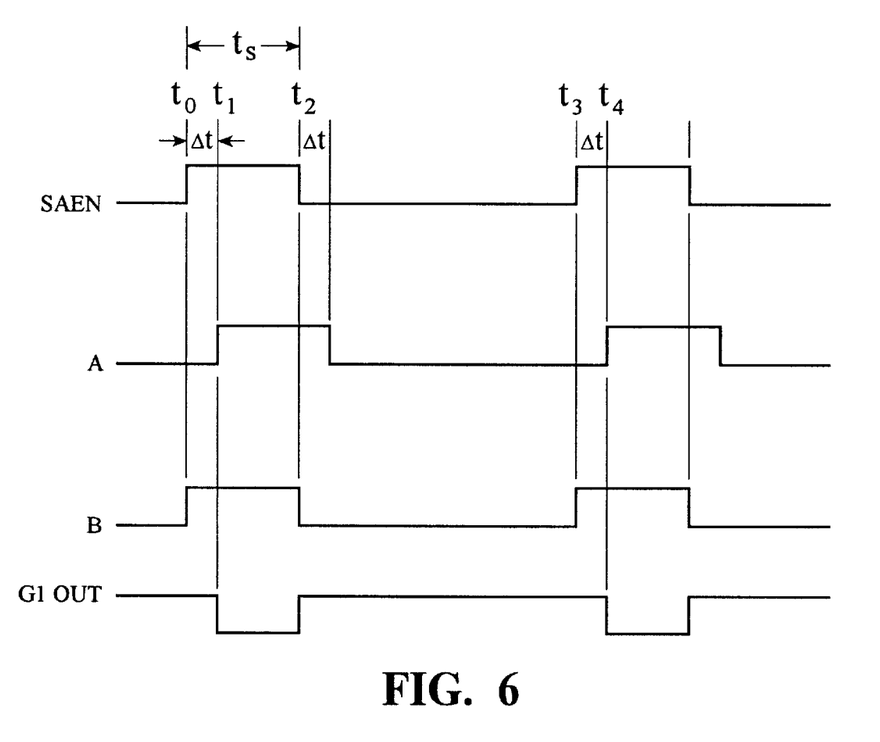
FIG. 6 is a timing diagram showing the operation of the sense amp of the present invention.

Turn now to the timing of the input signals at inputs A and B of NAND gate G1 during power-up shown in FIG. 6. Prior to time $t_0$, and for a period of time $\Delta t$ after $t_0$, NAND gate G1 is HI since A and B are both LO. Latch 250, therefore, is able to retain its state by virtue of transmission gate 252 being on. At the same time, latch 250 is isolated from the output 231 of diff. amp, since pass transistor 256 is off.

Because of the delay capacitors C1–C4, the signal at input A arrives subsequent to the signal at input B and thus gate G1 remains HI until time $t_1$, $\Delta t$ units after SAEN goes HI. At $t_1$, gate G1 goes LO which turns off transmission gate 252, thus clearing the latch and disabling it. Also pass transistor 256 is turned on, thus connecting the output of diff. amp 230 to the latch. The delay path ensures that the state of the latch (and hence the previously sensed data) is retained until after the sense amp is fully powered.

Continuing, consider when the sense amp begins its power-down sequence as SAEN transitions from HI to LO. Referring back to FIG. 5, the output of inverter I1 goes HI which turns off transistor 246, thus removing $V_{cc}$ from transistors T1, T6, T7, and T12. In addition, transistor T17 is turned off (via inverter 242), thus disabling the diff. amp 230. The output of inverter I2 next goes LO which turns off transistors T4 and T10, thereby shutting down the voltage reference stages 210, 220. At this time, the power-down sequence for the sense amp has completed.

Referring to FIG. 6 at time $t_2$, the signal at the B input, being coupled directly to NAND gate G1, follows SAEN without delay. This causes G1 to transition HI as soon as SAEN goes LO. The diff. amp output 231 is latched into latch 250 by virtue of the transmission gate turning on. At the same time, pass transistor 256 is turned off so that the latch 250 is isolated from the rest of the sense amp circuitry as it is being powered down as described above. Thus, the sensed data is saved before power-down of the sense amp is complete. In addition, by de-coupling the sense amp output 231 from the latch, any transients which might occur during the power-down sequence will not corrupt the state of the latch.

Figure 7:
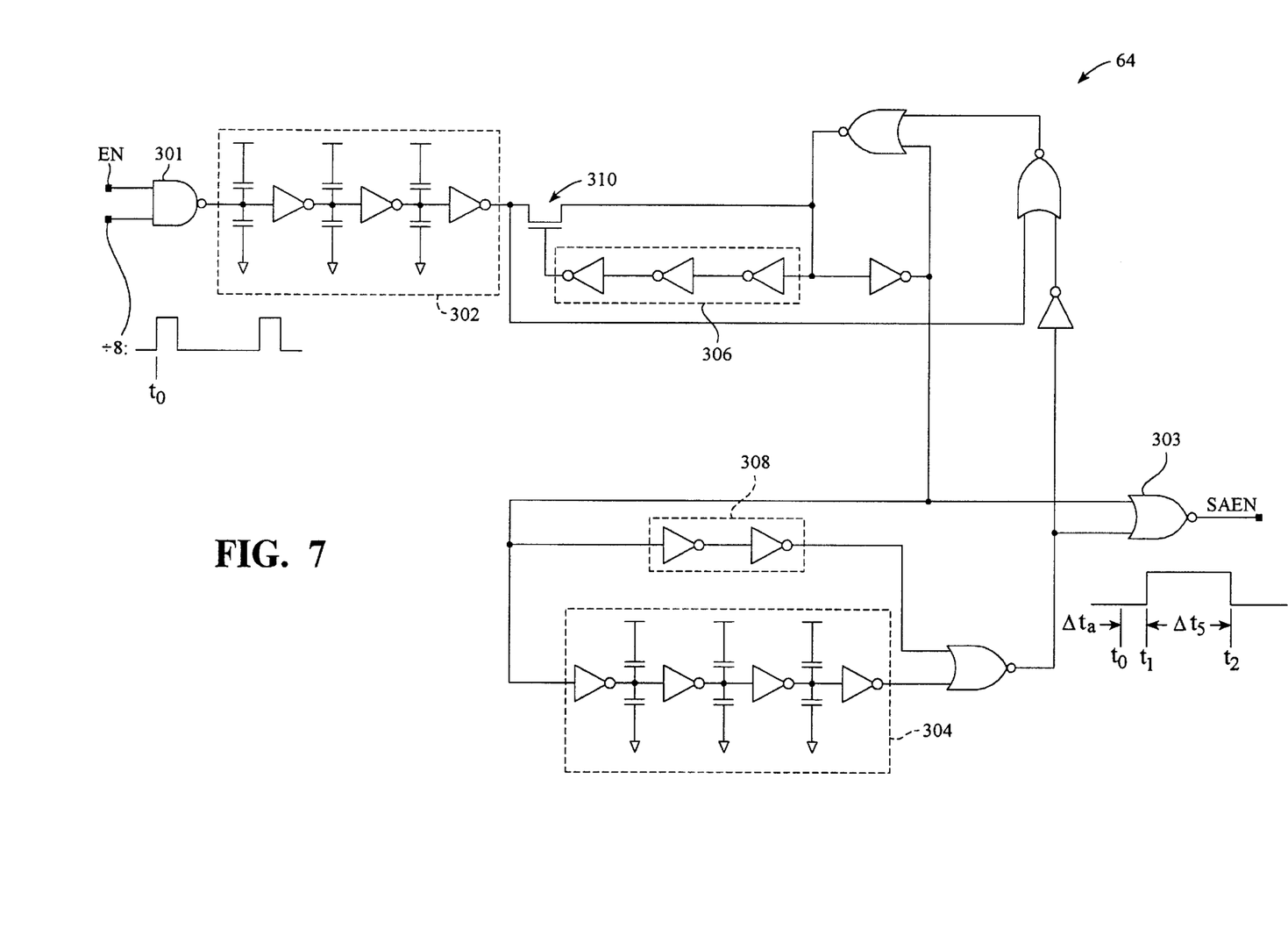
FIG. 7 illustrates a delay circuit used in conjunction with the sense amplifiers.

Refer now to FIG. 7 for additional detail of the timing circuit 64 shown in FIG. 4. The SAEN signal originates as the output of NOR gate 303 from the circuit shown in FIG. 7. NAND gate 301 enables the timing circuit when enabling signal EN goes HI. An incoming ÷8 clock signal received at NAND gate 301 is delayed by a decoder delay circuit 302 for a time $\Delta t_a$. Decoder delay 302 provides a time delay sufficient to allow incrementing the address register 40 (FIG. 1) and for the address decoders 60, 62 (FIG. 4) to access a memory location, prior to actually enabling the sense amplifiers 200. An inverter chain 306 ensures a minimum delay to allow for incrementing and decoding the next address, by delaying the biasing of pass transistor 310, in a situation where the pulse width of the ÷8 clock is too short.

After a delay $\Delta t_a$, the ÷8 clock causes the output (SAEN) of NOR gate 303 to go HI, thus turning on the sense amps 200. A sense delay circuit 304 delays the ÷8 clock to ensure that the SAEN pulse remains asserted for a period of time $\Delta t_s$ sufficient for the sense amps to sense the state of a memory cell.

The relative timing between the ÷8 clock and the SAEN pulses are shown in FIG. 7. At time $t_0$, the clock arrives and is delayed by circuit 302 for a period of time $\Delta t_1$. At time $t_1$, SAEN goes HI for a period of time $\Delta t_s$, enabling the sense amps 200. At time $t_2$ SAEN goes LO, thus turning off the sense amps.

Operation of the serial configuration memory will now be discussed with reference to the timing chart of FIG. 8. As indicated in the chart, an address is produced every eighth clock (via the ÷8 clock 60, FIG. 1). Thus at a certain clock (call it clock 1), an address transition begins. As explained above, shortly after clock 1 ($\Delta t_a$, FIG. 7) SAEN is asserted HI via timer 64 to turn on the sense amp circuitry 66. SAEN is HI for a period of time ($\Delta t_s$, FIG. 7) long enough to allow the eight bits of the addressed memory location to be sensed. SAEN then goes LO and the eight sensed bits are retained internally in the sense amp latches 250, the retained data being represented in FIG. 8 as INT DATA.

Figure 8:
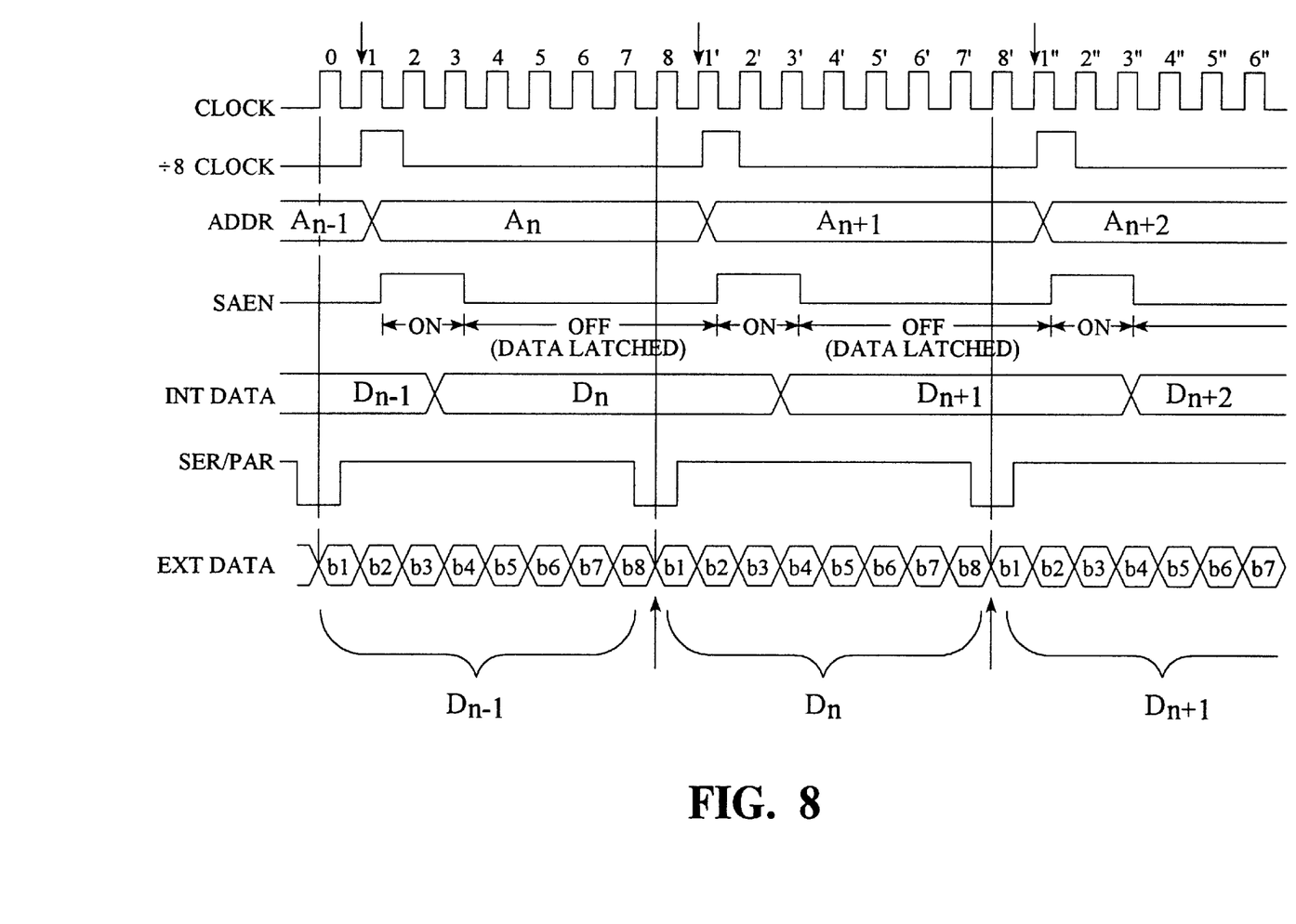
FIG. 8 is a timing diagram of the principal signals which participate in the operation of the invention.

Meanwhile, data bits from a previously read out memory location $D_{n-1}$ are being shifted out of data register 42, indicated in FIG. 8 as EXT DATA. In fact at clock 0, bit one of $D_{n-1}$ is being shifted out. Observe that for most of the time that data is being shifted out of data register 42, SER/PAR is HI, recalling from FIGS. 2A and 3 that this effectuates a right shift of the stored bits with each clock.

For clocks 1–7, bits 2–8 of $D_{n-1}$ are shifted out of the data register. At clock 7, bit 8 of $D_{n-1}$ is shifted out. Also at clock 7 SER/PAR is asserted LO for a period of time extending into clock 8. Referring once again to FIGS. 2A and 3, a LO on SER/PAR causes switch 41 to load the sensed data from the DATA LINEs 21n into the register latches 42n. In the case shown in FIG. 8 at clock 8, the data is $D_n$. Thus when clock 8 comes around, the next bit that is shifted out of the data register is the first bit of $D_n$, the memory location that was read out during clocks 1–7 (while $D_{n-1}$ was being shifted out) and stored in latches 250 of the sense amps 200.

During clocks 1'–7', the bits comprising $D_n$ are shifted out of the data register. As the timing chart shows, the process repeats. The next address $A_{n+1}$ is presented at clock 1', the sense amps are turned on to read out the eight bits of $D_{n+1}$, and latched into latches 250 just prior to turning off the sense amps. The $D_{n+1}$ bits remain in latches 250 until clock 7', at which time bit 8 of $D_n$ is shifted out and the $D_{n+1}$ bits are loaded into the data register (via SER/PAR being asserted LO), so that at clock 8', the next bit shifted out of data register 42 is the first bit of $D_{+1}$.

A few points worth noting: First, each of the eight sense amps 200 is turned on every eighth clock, and remains on only for a period of time sufficient to allow for decoding an address and for sensing a bit. As the timing chart illustrates, this permits the sense amps to be turned off most of the time during the eight clocks required to shift out a previously read-out byte. This greatly reduces the steady state current drawn by the sense amps, representing a significant reduction in power consumption.

Second, the resulting bitstream output is synchronous with the external clock. More importantly, the output rate of the bitstream is independent of the speed of operation of the sense amps. This is due to the pipeline processing technique used in the present invention. As the timing chart shows, the memory location being read out at any one time is always one location ahead of the memory location whose bits are being output. A memory location is always being 'pre-fetched' while a previously 'fetched' location is being output. This overlapping of the read out operation and the bitstream output operation de-couples the bitstream rate from the speed of the sense amps. Thus, the rate of the bitstream is no longer limited by the speed of the sense amp, as in prior art designs. Rather, the bit rate is a function only of the external clock frequency.

Third, this architecture is easily scaled up for data sizes larger than eight-bit data. For example, a sixteen-bit data path can be accommodated simply by providing additional sense amps. The relative timing would remain unchanged from that shown in FIG. 8. Thus, for higher clock frequencies, where conceivably the sense time might approach the time it takes to serially output eight bits, extending the data size to sixteen bits would provide a wider window of time during which data can be sensed.

FIG. 1 also shows a variation of the embodiment of the present invention. In this variation, the address counter 40 includes an input shown in phantom for receiving an initial address from an external source. This allows pre-setting the address counter to a memory location other than memory location zero so that the bitstream can begin from anywhere in the memory array 20. This is useful with reconfigurable FPGAs, where multiple configuration bitstreams may be stored in the configuration memory so that any one configuration can be sent to the FPGA at runtime.

We claim:

1. In a memory device having an array of memory cells organized as a plurality of N-bit data and having N sense amplifiers, wherein said memory device outputs a bit for each period of a clock signal, wherein each sense amplifier includes a differential amp stage, a reference voltage stage, and a data latch, a method of operating each sense amplifier, comprising:

(i) generating an enable pulse having a first logic level and a second logic level;

(ii) in response to said enable pulse being at said first logic level, enabling one of said differential amp stage and said reference voltage stage;

(iii) after enabling one of said differential amp stage and said reference voltage stage, enabling the other of said differential amp stage and said reference voltage stage; and (iv) after substep (ii), clearing said data latch and coupling said data latch to an output of said differential amp stage;

(v) changing said enable pulse to said second logic level; and (vi) in response to said enable pulse being at said second logic level, latching said output of said differential amp stage;

(vii) after latching said output, disabling one of said differential amp stage and said reference voltage stage; and (viii) after disabling one of said differential amp stage and said reference voltage stage, disabling the other of said differential amp stage and said reference voltage stage.

2. The method of claim 1 wherein said step of generating said enable pulse includes synchronizing with said clock signal to generate said enable pulse every Nth clock.

3. The method of claim 1 wherein said step of generating said enable pulse includes: (A) dividing down the frequency of said clock signal by N; and (B) delaying said divided down clock signal by an amount of time sufficient to decode a memory address of an N-bit datum.

4. The method of claim 1 wherein said step of changing said enable pulse includes delaying for a predetermined period of time subsequent to generating said enable pulse and prior to changing said enable pulse; said predetermined period of time sufficient to read out a memory cell.

5. The method of claim 4 wherein said step of generating said enable pulse includes synchronizing with said clock signal to generate said enable pulse every Nth clock signal.

6. The method of claim 5 wherein said differential amp stage is enabled prior to enabling said reference voltage stage, and disabled prior to disabling said reference voltage stage.

7. A data sensing circuit for use in a memory device having a plurality of memory cells organized as N-bit data, wherein said data sensing circuit senses the N bits of an accessed memory location and wherein said memory device outputs a bitstream at a rate of one bit per period of a clock signal; said data sensing circuit comprising:

a plurality of sense amplifiers, each sense amplifier including a differential amplifier stage, a reference voltage stage and a data latch;

pulse means for generating a control pulse every Nth cycle of said clock signal, said control pulse being at a first logic level for a duration of time Δ-t, Δ-t being a period of time sufficient to read out a memory cell, and said control pulse being at a second logic level at all other times;

control means, coupled to said pulse means and to said sense amplifiers, for enabling said differential amplifier stage prior to enabling said reference voltage stage, and for disabling said differential amplifier stage prior to disabling said reference voltage stage, and means for electrically coupling said data latch to an output of said differential amplifier stage, said control means further effective for enabling said coupling means subsequent to enabling said differential amplifier stage and said reference voltage stage, and for disabling said coupling means prior to disabling said differential amplifier stage and said reference voltage stage.

8. The data sensing circuit of claim 7 wherein said pulse means includes means for delaying said control pulse for a period of time sufficient to decode a memory location address.

9. The data sensing circuit of claim 8 wherein said sense amplifiers are enabled only for the time needed to read out a memory cell.

10. The data sensing circuit of claim 7 wherein the number of the plurality of sense amplifiers is equal to N.

11. A sense amplifier for use in a memory device having an array of memory cells organized as a plurality of N-bit data and having N such sense amplifiers for simultaneously reading out the N bits of an accessed memory location, wherein said memory device outputs a bit for each period of a clock signal, said sense amplifier comprising:

a differential amplifier stage, including an input coupled to sense the state of a memory cell;

a reference voltage stage coupled to provide a reference voltage to said differential amplifier stage;

a data latch to hold the state of a sensed memory cell:

timing means for producing a control pulse every N cycles of said clock signal, said control pulse having a pulse width sufficient to allow reading out an accessed memory cell;

a first circuit to electrically couple said data latch to an output of said differential amplifier stage in the absence of said control pulse, and to electrically decouple said data latch in the presence of said control pulse;

a second circuit to enable said differential amplifier stage in the presence of said control pulse, and to disable said differential amplifier stage in the absence of said control pulse; and a third circuit to enable said reference voltage stage in the presence of said control pulse, and to disable said reference voltage stage in the absence of said control pulse.

12. The sense amplifier of claim 11 wherein said timing means includes delay means for delaying said control pulse by a time Δ-t, Δ-t being a period of time sufficient to decode a memory address.

13. The sense amplifier of claim 11 further including a delay means for applying said control pulse to said second circuit prior to applying said control pulse to said third circuit.

14. The sense amplifier of claim 13 wherein said delay means further includes means for applying said control pulse to said first circuit subsequent to applying said control pulse to said third circuit.

15. The sense amplifier of claim 11 wherein said timing means comprises:

a first inverter having an input for receiving said control pulse and an output coupled to said second circuit;

a second inverter series coupled to said first inverter and having an output coupled to said third circuit;

a delay circuit series coupled to said second inverter; and a NAND gate having a first input coupled to receive an output of said delay circuit, and having a second input coupled to receive said control pulse, an output of said NAND gate coupled to said first circuit.

* * * * *